(12) United States Patent
Kolodzey et al.

(10) Patent No.: US 7,386,016 B2
(45) Date of Patent: Jun. 10, 2008

(54) TERAHERTZ FREQUENCY RADIATION SOURCES AND DETECTORS BASED ON GROUP IV MATERIALS AND METHOD OF MANUFACTURE

(75) Inventors: James Kolodzey, Landenberg, PA (US); Samit Kumar Ray, Iit Kharagpur (IN); Thomas N. Adam, Poughkeepsie, NY (US); Pengcheng Lv, Newark, DE (US); Ralph Thomas Troeger, Owing Mills, MD (US); Miron S. Kagan, Moscow District (RU); Irina N. Yassievich, St. Petersburg (RU); Maxim A. Odnoblyudov, St. Petersburg (RU)

(73) Assignee: University of Delaware, Newark, DE (US)

( * ) Notice: Subject to any disclaimer, the term of this patent is extended or adjusted under 35 U.S.C. 154(b) by 320 days.

(21) Appl. No.: 10/820,185

(22) Filed: Apr. 7, 2004

(65) Prior Publication Data
US 2004/0228371 A1    Nov. 18, 2004

Related U.S. Application Data

(60) Provisional application No. 60/461,656, filed on Apr. 9, 2003.

(51) Int. Cl.
*H01S 3/30* (2006.01)
(52) U.S. Cl. ........................................ 372/4; 372/43.01
(58) Field of Classification Search ................ 372/4
See application file for complete search history.

(56) References Cited

U.S. PATENT DOCUMENTS 5,675,414 A * 10/1997 Rowell et al. .............. 356/451
5,793,787 A * 8/1998 Meyer et al. ............ 372/45.01
5,914,497 A 6/1999 Sherwin
6,011,810 A * 1/2000 Haller et al. ............. 372/45.01
6,154,475 A * 11/2000 Soref et al. ............ 372/45.011

OTHER PUBLICATIONS

T-Ray Imaging by D. Mittleman et al. in IEEE Journal of Selected Topics in Quantum Electronics vol. 2, 1996.
Terahertz Technology by P. Siegel in IEEE Transactions on Microwave Theory and Techniques vol. 50, 2002.
Intersubband Electroluminescence from Silicon-Based Quantum Cascade Structures, Science vol. 290, Dec. 22, 2000.
Stimulated Emission from Donor-Transitions in Silicon, Physical Review Letters 84 (2000) by S. Pavlov et al.
T.N. Adam, R.T. Troeger, S.K. Ray, P.-C. LV, and J. Kolodzey; Terahertz elecroluminescence from boron-doped silicon devices; Applied Physics Letters; Sep. 1, 2003; pp. 1713-1715; vol. 83, No. 9; American Institute of Physics.

(Continued)

Primary Examiner—Minsun Oh Harvey
Assistant Examiner—Tod T. Van Roy
(74) Attorney, Agent, or Firm—RatnerPrestia (57) ABSTRACT

An electrically-pumped terahertz (THz) frequency radiation source (or detector), including an optical gain (or absorption) material with two electrodes electrically coupled to the optical gain material. The optical gain (or absorption) material is formed substantially of at least one group IV element and doped with at least one dopant, which has an intra-center transition frequency in a range of about 0.3 THz to 30 THz. Also, a method of manufacturing electrically-pumped THz frequency radiation sources (or detectors).

20 Claims, 7 Drawing Sheets

OTHER PUBLICATIONS

Mikio Fujiwara, Takanori Hirao, Mitsunobu Kawada, Hiroshi Shibai, Shuji Matsuura, Hidehiro Kaneda, Mikhail Patrashin, and Takao Nakagawa; Development of a gallium-doped germanium far-infrared photoconductor direct hybrid two-dimensional array; Applied Optics; Apr. 20, 2003; pp. 2166-2173; vol. 42, No. 12; Optical Society of America.

Serguei G. Pavlov, Heinz-Wilhelm Hübers, Roman KH. Zhukavin, Ekaterina E. Orlova, Helge Riemann and Valery N. Shastin; Optically pumped terahertz silicon lasers; pp. 93-96; 2002; IEEE.

I.V. Altukhov, E.G. Chirkova, V.P. Sinis, M.S. Kagan, UY. P. Gousev, S.G. Thomas, K.L. Wang, M.A. Odnoblyudov, I.N. Yassievich; Towards $Si_{1-x}GE_x$ quantum-well resonant-state terahertz laser; Applied Physics Letters; Dec. 10, 2001; pp. 3909-3911; vol. 79, No. 24; American Institute of Physics.

Yu.P. Gousev, I.V. Altukhov, K.A. Korolev, V.P. Sinis, M.S. Kagan, E.E. Haller, M.A. Obnoblyudov, I.N. Yassievich and K.-A. Chao; Widely tunable continuous-wave THz laser; Aug. 9, 1999; pp. 757-759; vol. 75, No. 6; American Institute of Physics.

* cited by examiner

TERAHERTZ FREQUENCY RADIATION SOURCES AND DETECTORS BASED ON GROUP IV MATERIALS AND METHOD OF MANUFACTURE

CROSS-REFERENCE TO RELATED APPLICATIONS

This application claims the benefit of U.S. Provisional Application No. 60/461,656, filed Apr. 9, 2003, the contents of which are incorporated herein by reference.

FIELD OF THE INVENTION

The present invention concerns electrically-pumped terahertz (THz) frequency radiation sources and detectors using doped group IV materials as optical and absorption gain media. These optical gain media may also serve as the gain media of electrically-pumped THz frequency laser structures.

BACKGROUND OF THE INVENTION

Imaging, communication, and spectroscopic applications in the mid- and far-infrared regions have underscored the importance of developing reliable sources and detectors operating in the frequency range from 0.3 to 10 THz (1000 to 30 µm wavelength). Recent studies, such as *T-Ray Imaging* by D. Mittleman et al. in IEEE Journal of Selected Topics in Quantum Electronics vol. 2 1996 and *TeraHertz Technology* by P. Siegel in IEEE Transactions on Microwave Theory and Techniques vol. 50 2002, suggest that terahertz interactions can enable a variety of new applications on a wide range of solids, liquids, gases, including polymers and biological materials such as proteins and tissues.

For example, the resonant frequencies of many rotational and stretching transitions in complex organic molecules, such as proteins, are in this frequency range. Also, phonon energies of polar molecules may be in this range. Thus, THz frequency radiation sources may find significant uses in the fields of spectroscopic analysis and/or photochemical processes involving these molecules.

Additionally, many materials are relatively transparent to THz frequency radiation, making a number of imaging applications are possible. This allows THz frequency radiation to be used to create images similar to X-rays. As the photon energy of THz frequency radiation is significantly less than that of X-rays, THz frequency radiation, or T-ray, images may be made without the ionizing radiation associated with X-ray images. Thus, T-ray images may present fewer potential risks to the patient than present X-ray images.

Compared to microwave devices, devices operating in the THz, or far-infrared, frequency range may allow significant reductions in antenna size, as well as providing greater communication bandwidth. Additionally, the shorter wavelength of THz frequency waves, compared to microwaves, allows greater resolution with THz frequency waves than is possible with microwaves. Commercial applications may include thermal imaging, remote chemical sensing, molecular spectroscopy, medical diagnosis, fire and combustion control, surveillance, and vehicle driver vision enhancement. Military applications may include night vision, rifle sight enhancement, missile tracking, space-based surveillance, and target recognition.

Quantum cascade lasers (QCL's) fabricated from III-V materials have demonstrated light emission at wavelengths typically shorter than 10 µm over large temperature ranges. However, these III-V compound semiconductor devices may have limitations due to the strong reststrahlen phonon absorption at THz frequencies. THz frequency radiation has also reported from silicon-based quantum well structures by G. Dehlinger et al. in *Intersubband Electroluminescence from Silicon-Based Quantum Cascade Structures*, Science, vol. 290, Dec. 22, 2000. As with the III-V material QCL's, these silicon-based quantum cascade devices require the use of carefully controlled, epitaxial-processing techniques to form quantum well structures with sub-nanometer dimensional tolerances.

Optically-pumped, phosphorus-doped silicon THz emitters have also been reported in *Stimulated Emission from Donor Transitions in Silicon*, Physical Review Letters 84 (2000) by S. Pavlov et al. These optically-pumped emitters suffer from a small absorption cross-section for the $CO_2$ laser radiation (10.6 µm wavelength) used to pump the devices.

SUMMARY OF THE INVENTION

An exemplary embodiment of the present invention is an electrically-pumped THz frequency radiation source, including an optical gain material with two electrodes electrically coupled to the optical gain material. The optical gain material is formed substantially of at least one group IV element and doped with at least one dopant, which has an intra-center transition frequency in a range of about 0.3 THz to 30 THz.

Another exemplary embodiment of the present invention is a method of manufacturing a THz frequency radiation source. An optical gain material is provided. The optical gain material is formed substantially of at least one group IV element and is doped with at least one dopant, which has an intra-center transition frequency in a range of about 0.3 THz to 30 THz. First and second electrodes are formed so as to be electrically coupled to the optical gain material.

An additional exemplary embodiment of the present invention is an alternative method of manufacturing a THz frequency radiation source. A substrate is provided. An optical gain material layer is deposited on the substrate. The optical gain material layer is formed substantially of at least one group IV element and is doped with at least one dopant, which has an intra-center transition frequency in a range of about 0.3 THz to 30 THz. First and second electrodes are formed so as to be electrically coupled to the optical gain material layer.

A further exemplary embodiment of the present invention is another alternative method of manufacturing a THz frequency radiation source. A substantially undoped material formed substantially of at least one group IV element is provided. At least a portion of the substantially undoped material is doped with at least one dopant, which has an intra-center transition frequency in a range of about 0.3 THz to 30 THz, to form an optical gain material region. First and second electrodes are formed so as to be electrically coupled to the optical gain material region.

Still another exemplary embodiment of the present invention is a THz frequency radiation detector, including an optical absorption material with two electrodes electrically coupled to the optical gain material. The optical absorption material is formed substantially of at least one group IV element and doped with at least one dopant, which has an intra-center transition frequency in a range of about 0.3 THz to 30 THz.

Still an additional exemplary embodiment of the present invention is a method of manufacturing a THz frequency radiation detector. An optical absorption material is provided. The optical absorption material is formed substantially of at least one group IV element and is doped with at least one dopant, which has an intra-center transition frequency in a range of about 0.3 THz to 30 THz. First and second electrodes are formed so as to be electrically coupled to the optical absorption material.

A still further exemplary embodiment of the present invention is an alternative method of manufacturing a THz frequency radiation detector. A substrate is provided. An optical absorption material layer is deposited on the substrate. The optical absorption material layer is formed substantially of at least one group IV element and is doped with at least one dopant, which has an intra-center transition frequency in a range of about 0.3 THz to 30 THz. First and second electrodes are formed so as to be electrically coupled to the optical absorption material layer.

Yet another exemplary embodiment of the present invention is another alternative method of manufacturing a THz frequency radiation detector. A substantially undoped material formed substantially of at least one group IV element is provided. At least a portion of the substantially undoped material is doped with at least one dopant, which has an intra-center transition frequency in a range of about 0.3 THz to 30 THz, to form an optical absorption material region. First and second electrodes are formed so as to be electrically coupled to the optical absorption material region.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION OF THE INVENTION

The present invention involves the design and fabrication of semiconductor devices capable of producing and/or detecting THz frequency radiation. These exemplary devices are desirably formed in a group IV semiconductor material that has been doped with a dopant that has at least one intra-center transition in the THz frequency range. Electromagnetic radiation in the THz frequency range may be generated in group IV materials by electronic transitions in group III and V impurities, such as boron, phosphorus, gallium, antimony, arsenic, and aluminum. Although the exact mechanism is still unclear, it may be attributed to the hydrogenic character of the orbitals of these impurities. It is noted that polar phonons may be absent in the group IV semiconductor materials of these exemplary devices, offering the capability of low-loss guiding and reduced free-carrier absorption of THz frequency radiation in these materials.

A number of THz frequency devices utilizing impurity transitions in doped group IV semiconductors are described in the exemplary embodiments below. Exemplary THz frequency radiation emitters according to the present invention are desirably electrically-pumped and produce THz frequency radiation with greater efficiency than previously seen in other electrically-pumped THz frequency radiation sources, such as the Si/SiGe quantum cascade structures reported by G. Dehlinger et al.

Although it is contemplated that any group IV semiconductor material may be used in the exemplary embodiments of the present invention, it is noted that the silicon and germanium material systems may have particular advantages. These material families are used in many established technologies and, thus, may utilize a number of well developed fabrication processes, such as monolithic circuit integration, which may allow relatively easy integration of THz frequency optical chips with additional circuitry capable of performing, for example, powerful signal processing algorithms. Additionally, silicon- or germanium-based designs may allow for simplified integration and better thermal conductivity between the optical gain material of the THz frequency device and substrates and/or device packages. Alternatively, it is noted that diamond and silicon carbide structures may offer advantages of mechanical stability and durability.

Figure 2A:
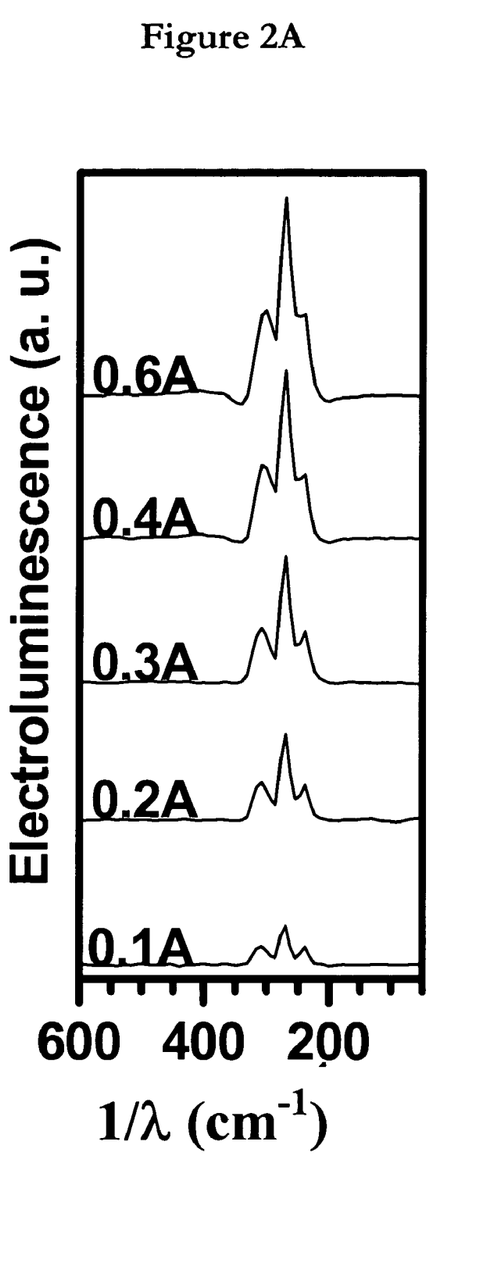
FIG. 2A is a graph illustrating the dependence of electroluminescence intensity (relative units) on wavenumber at various drive currents for a similar exemplary boron-doped, silicon device, at a temperature of 4K.
Figure 2B:
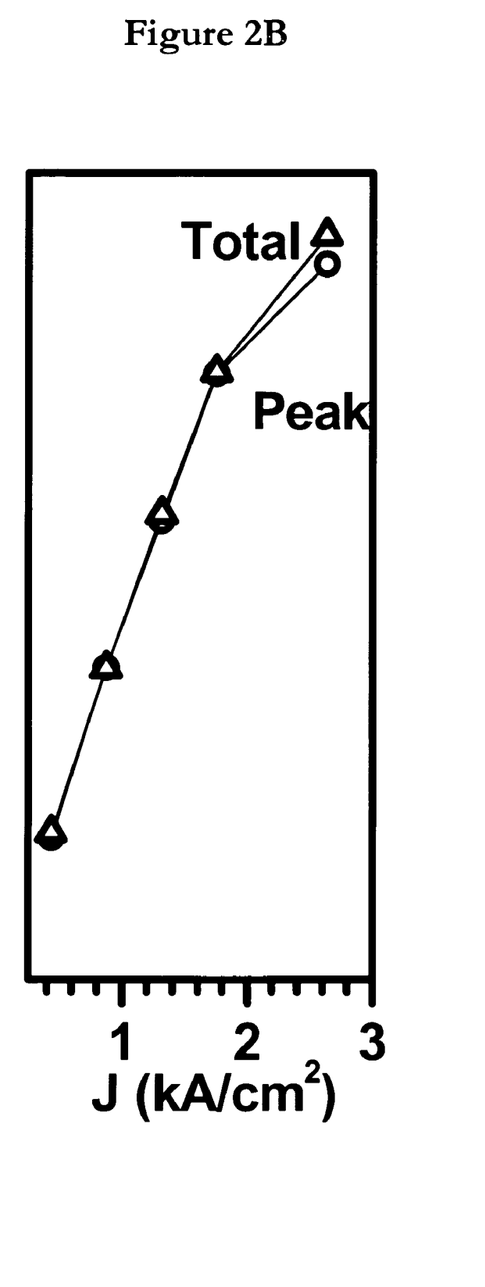
FIG. 2B is a graph illustrating the dependence of electroluminescence intensity (relative units) on current density for the exemplary device of FIG. 2A.
Figure 3:
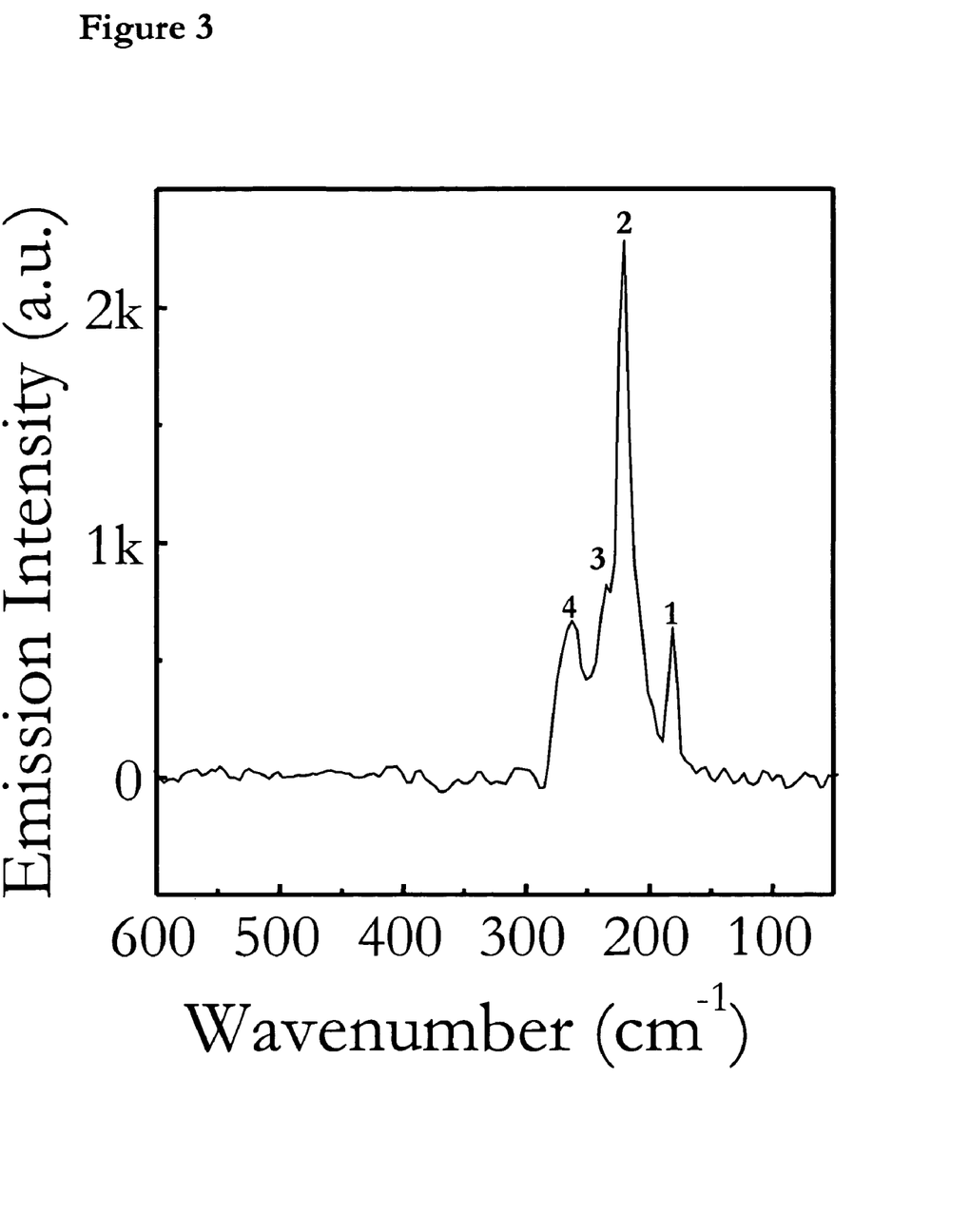
FIG. 3 is a graph illustrating the dependence of electroluminescence intensity (relative units) on wavenumber for an exemplary phosphorus-doped (slightly co-doped with boron), silicon device with a resistivity of approximately 5 $\Omega$-cm, at a temperature of 12.3K.
Figure 4A:
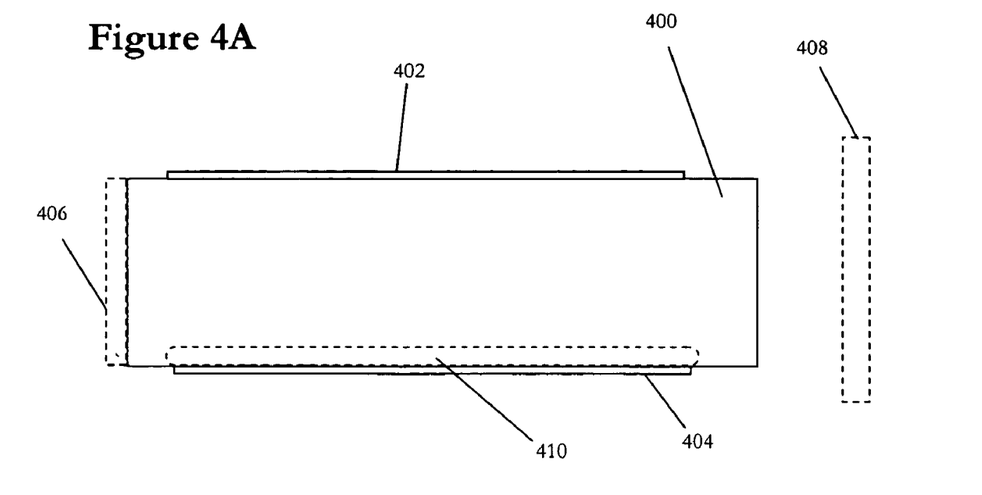
FIGS. 4A, 4B, and 4C are side plan drawings of exemplary electrically-pumped THz frequency radiation sources, or THz frequency radiation detectors, according to the present invention.
Figure 4B:
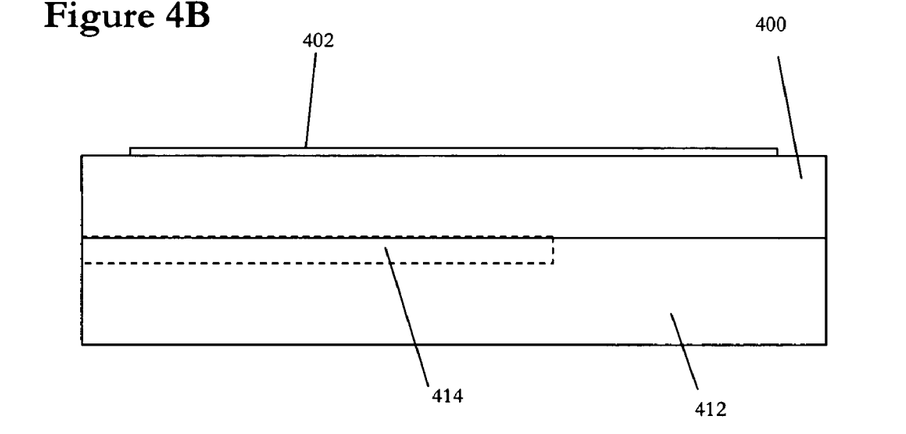
Figure 4C:
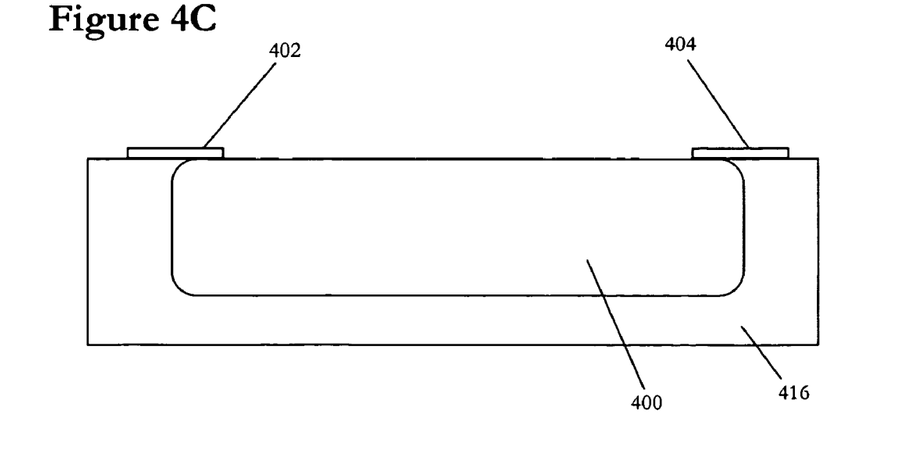

FIGS. 1, 2A, 2B, and 3 illustrate experimental data from exemplary THz frequency radiation emitters constructed according to the exemplary embodiment of FIG. 4A. FIGS. 4A-C illustrate side-plan drawings of exemplary THz frequency radiation sources (or detectors) based on impurity transitions in doped group IV materials. The prospective features shown in phantom in FIGS. 4A and 4B illustrate additional exemplary embodiments of the present invention. It is noted that, although these exemplary devices are generally described below in terms of their operation as radiation sources, one skilled in the art may understand that, as with other electrically-pumped quantum radiation sources, the same exemplary devices may form the basis of radiation detectors, by changing the bias circuitry.

Figure 1:
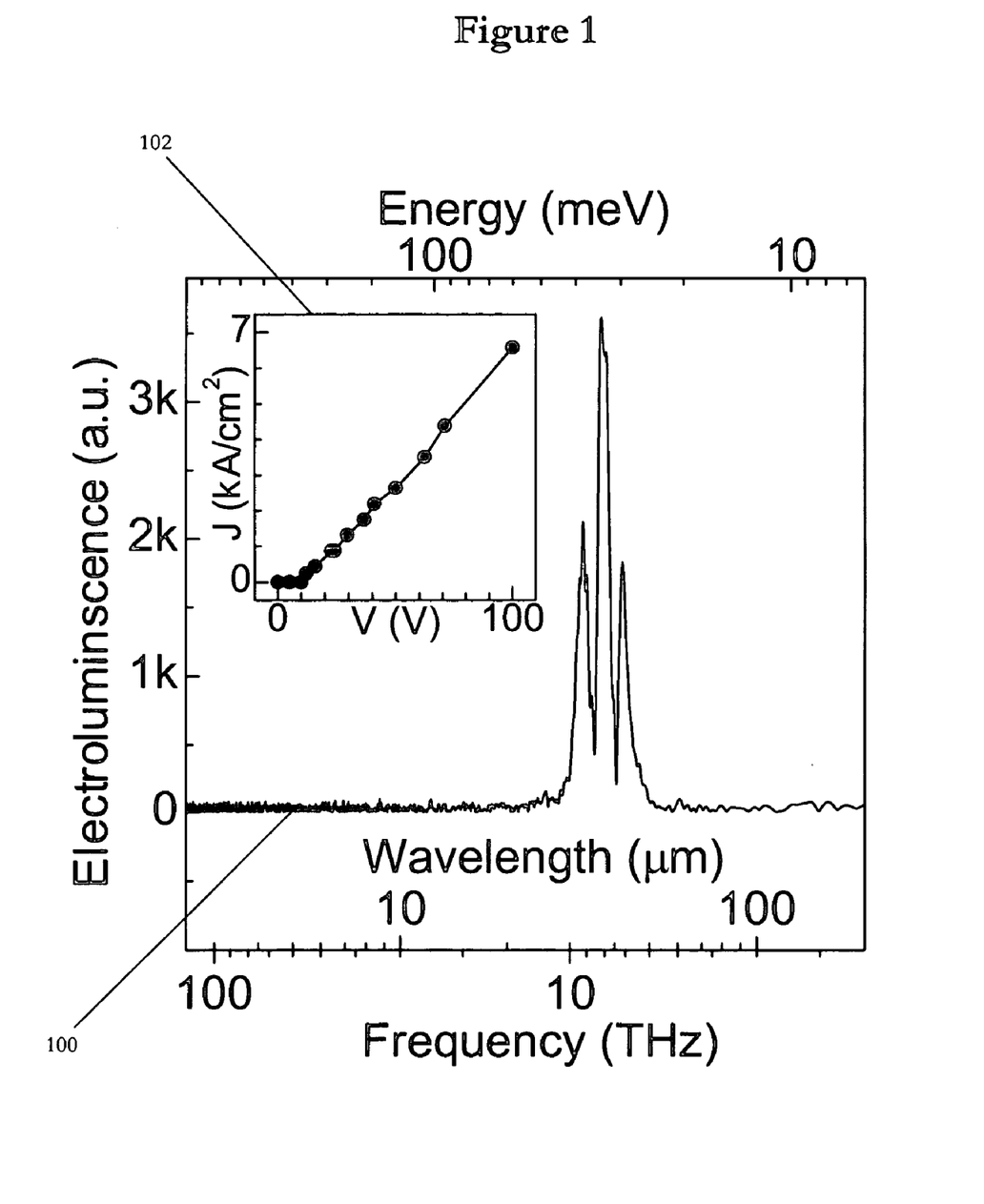
FIG. 1 is a graph illustrating the dependence of electroluminescence intensity (relative units) on frequency (as well as wavelength and photon energy) for an exemplary boron-doped, silicon device with a resistivity of 1-10 $\Omega$-cm, at a temperature of 4.4K.

FIG. 1 shows trace 100, depicting test results for electroluminescence at 4.4 K obtained from an exemplary THz frequency radiation emitter according to the present invention, for example, the exemplary emitter shown in FIG. 4. The exemplary THz frequency emitter used for the data of FIG. 1 includes a 380 µm thick piece of crystalline silicon optical gain material 400 doped with boron to obtain a resistivity in the range of 1-10 Ω-cm. Titanium/platinum/gold electrodes 402 and 404 were formed on the top and bottom surfaces, respectively, of optical gain material 400. The exemplary device used to obtain the data in FIG. 1 measured approximately 120 μm×190 μm.

The data in trace 100 resulted from driving this exemplary device with a pulsed current having a peak current and voltage of 1.5 A and 100 V, respectively. Pulsed current trains of 727 pulses with 150:1000 ns (width:period) were applied at a repetition rate of 413 Hz. The use of pulse trains helps to reduce heating of exemplary device. The spectral power emitted from one mesa facet of an exemplary device was recorded using a Fourier transform infrared spectrometer (FTIR) equipped with a silicon bolometer in a step-scan mode to obtain a resolution of 4 $cm^{-1}$. The FTIR was calibrated using a recessed-cone-type blackbody radiator.

Trace 100 corresponds to the maximum output power from one mesa facet of the exemplary device and illustrates a THz range frequency spectrum having three narrow peaks centered around 8.1 THz. For efficient generation of THz frequency radiation, control of the resistivity of the optical gain material in these devices is desirable. The data in trace 100 is typical of several devices tested that had resistivities in the 1-10 Ω-cm range. It is noted that exemplary devices fabricated from substantially undoped (>1000 Ω-cm), and highly doped (0.01 Ω-cm) silicon wafers did not yield significant THz emissions. Inset 102 depicts the current density versus voltage characteristic of the exemplary device used in FIG. 1.

The emission energies shown in trace 100 correspond well to published values for the $P_{3/2}$ absorption lines in boron-doped silicon. Therefore, the THz frequency emission observed from these exemplary devices may be attributed to electrically excited hole transitions between boron dopant levels. However, the exact excitation mechanism of the states involved is unclear. It is noted that the center peak was the strongest for all exemplary devices tested. The time-averaged spectral power of the center peak in trace 100 is 384 nW/meV.

FIGS. 2A and 2B illustrate exemplary emission energies from another exemplary device fabricated from a p-type boron-doped silicon wafer with a resistivity of 1-10 Ω-cm (corresponding to an acceptor concentration, $N_A \approx 10^{16}$ to $10^{15}$ $cm^{-3}$). The emitted radiation was not polarized. FIG. 2A shows the dependence of electroluminescence intensity (relative units) on wavenumber for the exemplary boron-doped silicon device, at a temperature of 4K. FIG. 2B shows the dependence of time-averaged electroluminescence intensity (relative units) on current density for the exemplary device.

To obtain the data for FIGS. 2A and 2B, four 1-mil gold wires were wedge-bonded to top electrode 402 to ensure sufficient current carrying capability. The exemplary device was attached to the copper cold finger of a liquid-helium cryostat using low-temperature-compatible two-component silver epoxy that allowed rapid cooling to temperatures between 4.4 and 350 K, as well as providing electrical contact to bottom electrode 404. Voltage pulse trains of varying duty cycle and pulse numbers were applied to the devices using a pulse generator. The exemplary emission spectra shown in FIG. 2A were recorded using an FTIR in the step-scan mode calibrated with a black body source. At an applied current of 1.5 A, one device emitted a time averaged spectral power of 11.3 nW/cm at 8.1 THz, corresponding to pulses with a peak power of 3.78 μW integrated over the wavelength spread of the peak. The devices operated well up to temperatures of 20 K, above which the intensity rapidly diminished. This device may be useful as a THz source that can be integrated with silicon circuits without the need for silicon-germanium epitaxy.

The vertical scale versus wavenumber in FIG. 2A is offset to separate the curves represent different pumping currents. FIG. 2A demonstrates that the spectral shape is relatively constant with increasing pump current. The peak at 270 $cm^{-1}$ corresponds to 8.1 THz. Also, as illustrated in FIG. 2B, the intensity of the THz emissions increases linearly with pumping current density at low currents. (The open triangles correspond to the integrated intensity of all three emission lines, while the open circles correspond to the intensity of the central emission line.) The absence of square law dependence of intensity on current, and the sub linearity at higher current densities suggested that thermal blackbody radiation was negligible as a contribution to the observed THz emission.

FIG. 3 illustrates test results for the electroluminescence at 12.3 K obtained from another exemplary THz frequency radiation emitter. This exemplary THz frequency emitter includes a 380 μm thick piece of crystalline silicon optical gain material 400 co-doped with phosphorus (donor concentration, $N_D \approx 10^{15}$ $cm^{-3}$) and boron ($N_A < 10^{13}$ $cm^{-3}$) to obtain a resistivity of 5 Ω-cm. The boron may serve to partially compensate the phosphorus. Titanium/gold electrodes 402 and 404 were formed on the top and bottom surfaces, respectively, of optical gain material 400. This exemplary device also measured approximately 120 μm×190 μm.

The data in FIG. 3 resulted from driving this exemplary device with a pulsed current of 400 mA. Pulsed current trains of 100 pulses with 250:2500 ns (width:period) were applied at a repetition rate of 413 Hz to reduce heating of exemplary device. The spectral power emitted from one mesa facet of an exemplary device was recorded using an FTIR in a step-scan mode with a resolution of 4 $cm^{-1}$.

The spectrum shows four emission peaks: peak 1 at 22.5 meV (or alternatively, 5.43 THz, or 55.11 μm); peak 2 at 27.26 meV (6.58 THz, 45.49 μm); peak 3 at 29.17 meV (7.04 THz, 42.51 μm); and peak 4 at 32.38 meV (7.82 THz, 38.30 μm). The three lower energy emission peaks 1, 2, and 3 are sharper compared to peak 4. Peaks 1, 2, and 3 correspond well to known energies for the intra-center phosphorus transitions of $2p_0 \rightarrow 1s(T_2)$, $2p_-^+ \rightarrow 1s(T_2)$, and $3p_-^+ \rightarrow 1s(E)$, respectively. Broader peak 4, at 32.38 meV, may originate from several transitions, including $4p_-^+$, $5p_0, 5p_-^+, 6p_-^+ \rightarrow 1s$ ($T_2$). It is noted that peak 2 was the strongest for all exemplary phosphorus-doped devices tested. The maximum peak power measured for the exemplary device was approximately 20 μW/facet.

The exemplary electrically-pumped THz frequency radiation source (or detector) in FIG. 4A includes doped optical gain material 400 sandwiched between electrodes 402 and 404. Doped optical gain material 400 is desirably formed primarily of one or more group IV elements, such as silicon, germanium, and carbon. This material may be crystalline or it may be amorphous. Use of crystalline or amorphous silicon, germanium, and/or silicon-germanium alloys may be desirable due to the sophistication of readily available semiconductor technologies in these materials. Alternatively, diamond and/or silicon carbide may be desirable material choices due to the mechanical toughness of these materials. Polycrystalline silicon and amorphous diamond may be used as optical gain material 400 as well.

Doped optical gain material 400 is doped with at least one dopant having a THz frequency intra-center transition in a range of about 0.3 THz to 30 THz. This dopant intra-center transition frequency may typically be in the range of about 0.5 THz to 10 THz. Although any dopant having a THz frequency intra-center transition may be used, it may be desirable to use a shallow depth, group III or V dopant, such as boron, phosphorus, gallium, antimony, arsenic, and aluminum. It is also contemplated that deeper dopants, such as lithium and bismuth, may be desirably used as dopants in exemplary devices of the present invention. As noted above with reference to FIG. 1, it may be desirable for doped optical gain material 400 to have a resistivity in the range of about 1 to 10 Ω-cm.

It may be desirable to co-dope doped optical gain material 400 with two or more co-dopants. These co-dopants may be of the same carrier type (i.e. either electron donors or acceptors), or may include at least one co-dopant of each carrier type. Co-dopants of differing carrier types (e.g., boron and phosphorus, as utilized in the exemplary device used to generate the data in FIG. 3) may be added in differing concentrations. In this exemplary co-doping embodiment, the first, higher concentration co-dopant (phosphorus in the case of FIG. 3) desirably controls the output wavelength(s) of the device. The second, lower concentration co-dopant (boron in the case of FIG. 3) partially compensates the dopant concentration of the first co-dopant, helping to control the resistivity of doped optical gain material 400.

Co-dopants of the same carrier type (e.g., boron and gallium) may desirably be added in substantially similar concentrations. The two, or more, co-dopants in this exemplary co-doping embodiment desirably have different intra-center transition frequencies in the THz range. Therefore, the resulting exemplary device may emit THz frequency radiation at the various intra-center transition frequencies of the co-dopants, providing a broader output bandwidth, and potentially a higher efficiency.

Electrodes 402 and 404 are desirably formed of a conductive material such as aluminum, gold, silver, copper, nickel, titanium, tungsten, platinum, germanium, polyaniline, polysilicon or a combination thereof. These electrodes are desirably formed on surface portions of doped optical gain material 400. Although electrodes 402 and 404 are shown on the top and bottom surfaces, respectively, of doped optical gain material 400 in FIG. 4A, it may be understood by one skilled in the art that this electrode configuration is for convenience of illustration, and not limiting. The electrodes may be formed on other surfaces of doped optical gain material 400 and may even be formed on separate portions of the same surface (as shown in FIG. 4C).

It may be desirable for one or both of the electrodes to form a Schottky barrier contact with doped optical gain material 400. The resulting Schottky junction(s) may increase the efficiency of carrier injection from the electrodes into doped optical gain material 400, thus increasing the efficiency of THz frequency radiation generation in the exemplary device. Alternatively, one or both of electrodes 402 and 404 may form substantially ohmic contacts with doped optical gain material 400. In FIG. 4A, an alternative exemplary embodiment is shown in which electrode 404 forms an ohmic contact to highly doped region 410 (shown in phantom) of doped optical gain material 400.

As illustrated in the exemplary spectra of FIGS. 1, 2A, 2B, and 3, the emission spectra of these exemplary devices are fairly broad, even without the use of co-dopants of the same carrier type. Particularly for spectrographic applications, a narrow emission spectrum may be desirable. An alternative embodiment of the exemplary THz frequency radiation source shown in FIG. 4A may include reflectors such as facet 406 and mirror 408 to form a Fabry-Perot laser cavity with doped optical gain material 400 in the middle. The exemplary cavity may be formed by one reflective facet and one mirror, as shown in FIG. 4A, or may be formed by either two reflective facets at opposite ends of doped optical gain material 400 or two mirrors. Desirably at least one of the reflectors of the Fabry-Perot laser cavity has a reflectivity of less than 100% to allow an output beam to be transmitted. Careful alignment of the reflectors may desirably allow lasing on a limited number of modes, producing an exemplary THz laser with a greatly reduced bandwidth as compared to the exemplary THz frequency radiation sources illustrated in the exemplary spectra of FIGS. 1, 2A, 2B, and 3.

Reflective facet 406 may desirably be a cleaved facet, a multiple layer dielectric coating, or a metal coating that is electrically isolated. Mirror 408 may desirably be a metal or dielectric mirror, or may be an optical grating. If an optical grating is used as mirror 408, the grating may also be used to tune the output wavelength of the exemplary THz laser.

It is noted that a single reflector, either facet 406 or mirror 408, may be used to help control the output direction of the THz frequency radiation of the exemplary THz frequency radiation source, creating a more intense output beam.

Figure 5:
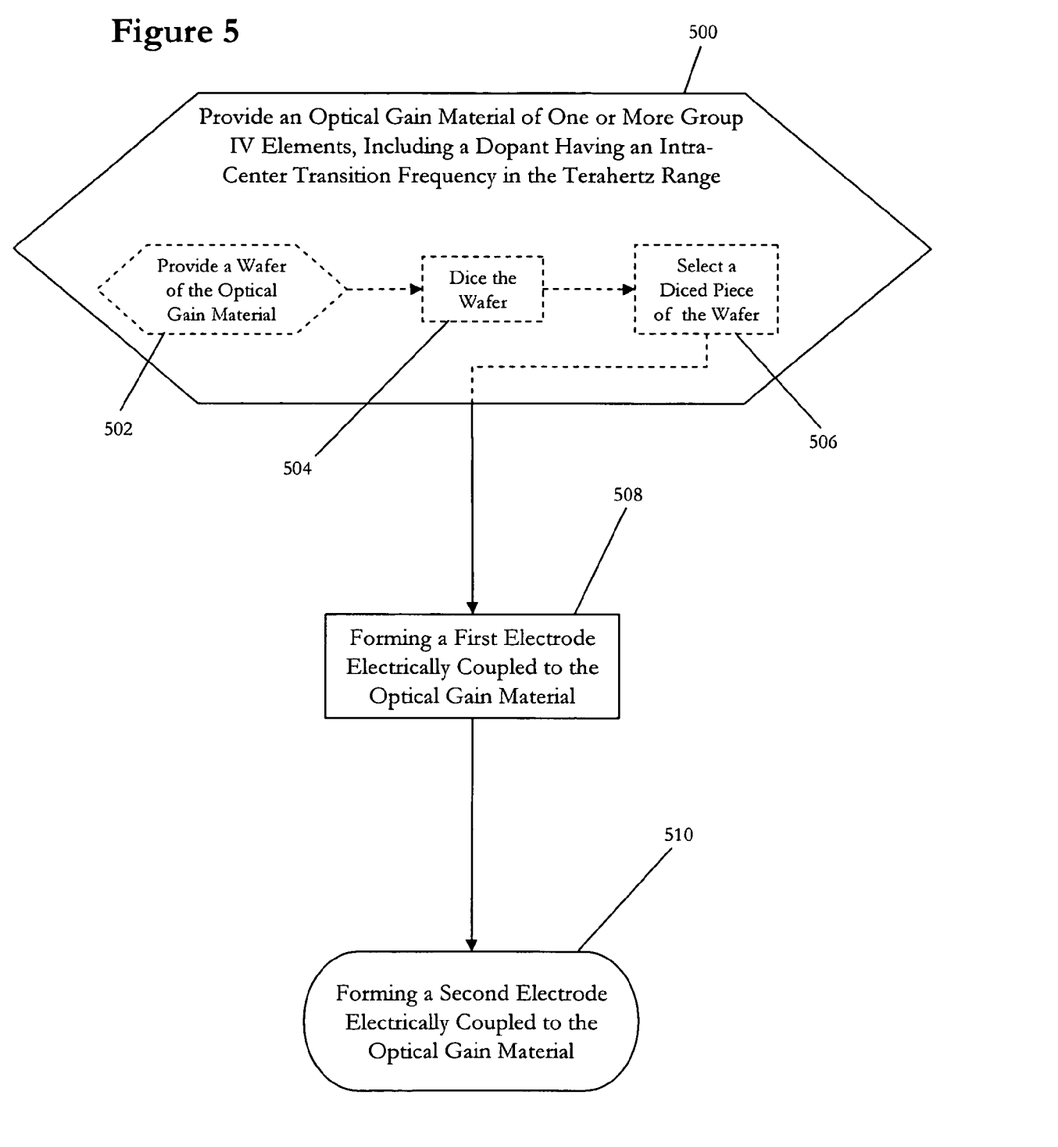
FIG. 5 is a flowchart illustrating a method of manufacture for the exemplary electrically-pumped THz frequency radiation source, or radiation detector, of FIG. 4A.

FIG. 5 illustrates an exemplary method of manufacturing an exemplary THz frequency radiation source according to FIG. 4A. Doped optical gain material 400, formed substantially of at least one group IV element and doped with at least one dopant having an intra-center transition frequency in a range of about 0.3 THz to 30 THz, is provided, step 500. One exemplary, non-limiting, process for providing doped optical gain material 400 is shown in phantom in FIG. 5. This exemplary process begins with providing a wafer formed substantially of the at least one group IV element and doped with the at least one dopant, alternative substep 502. The wafer may desirably be cleaned using a multi-step procedure (not shown) to remove organic and metallic contaminants and produce atomically smooth surfaces on the wafer. The wafer is diced to form a number of diced wafer pieces, alternative substep 504. As part of this alternative substep, rectangular mesas may be defined and desirably anisotropically reactive ion etched. It is noted that other wafer dicing procedures, such as cleaving, may also be used to perform this substep. One of the diced wafer pieces is selected as doped optical gain material 400, alternative substep 506. It is noted that it may be desirable to begin with a wafer and perform the processing steps of the exemplary method of FIG. 5 on a wafer level before dicing individual devices, so that alternative substeps 504 and 506 would follow step 510.

First electrode 402, which is electrically coupled to doped optical gain material 400, is formed, step 508, and second electrode 404, which is also electrically coupled to doped optical gain material 400, is formed, step 510. These electrodes may be desirably formed by depositing conductive material onto surface portions of doped optical gain material 400 by vaporization deposition, evaporation deposition, or sputtering. As described above with reference to FIG. 4A one or both of electrodes 402 and 404 may be formed by depositing a metal directly on the surface of the optical gain material to form a Schottky barrier contact. Alternatively, for one or both of the electrodes, the dopant concentration of a surface portion of doped optical gain material 400 may be increased and a conductive material deposited on that surface portion of the optical gain material to form a substantially ohmic contact.

FIG. 4B illustrates another exemplary THz frequency radiation source in which doped optical gain material 400 is coupled to substrate 412. Desirably, substrate 412 may be formed of a group IV material or alloy. Alternatively, substrate 412 may be formed of another material on which doped optical gain material 400 may be easily deposited and may include multiple layers. Substrate 412 may supply additional mechanical stability to the exemplary THz frequency radiation source of FIG. 4B and may assist in thermal management of the device. Additionally, substrate 412 may be electrically conductive and serve as the second electrode of the exemplary THz frequency radiation source. Alternatively, substrate 412 may be substantially electrically insulating and include circuitry and/or electrical connections that may be used to couple circuitry or a second electrode (not shown in FIG. 4B) to doped optical gain material 400.

Substrate 412 may also include distributed feedback element 414 (shown in phantom), which is optically coupled to doped optical gain material 400. Distributed feedback element 414, possibly coupled with a coated facet or external cavity mirror, may be used to induce the exemplary electrically-pumped THz frequency radiation source to emit coherent THz frequency radiation, forming an exemplary THz frequency distributed feedback laser.

Figure 6:
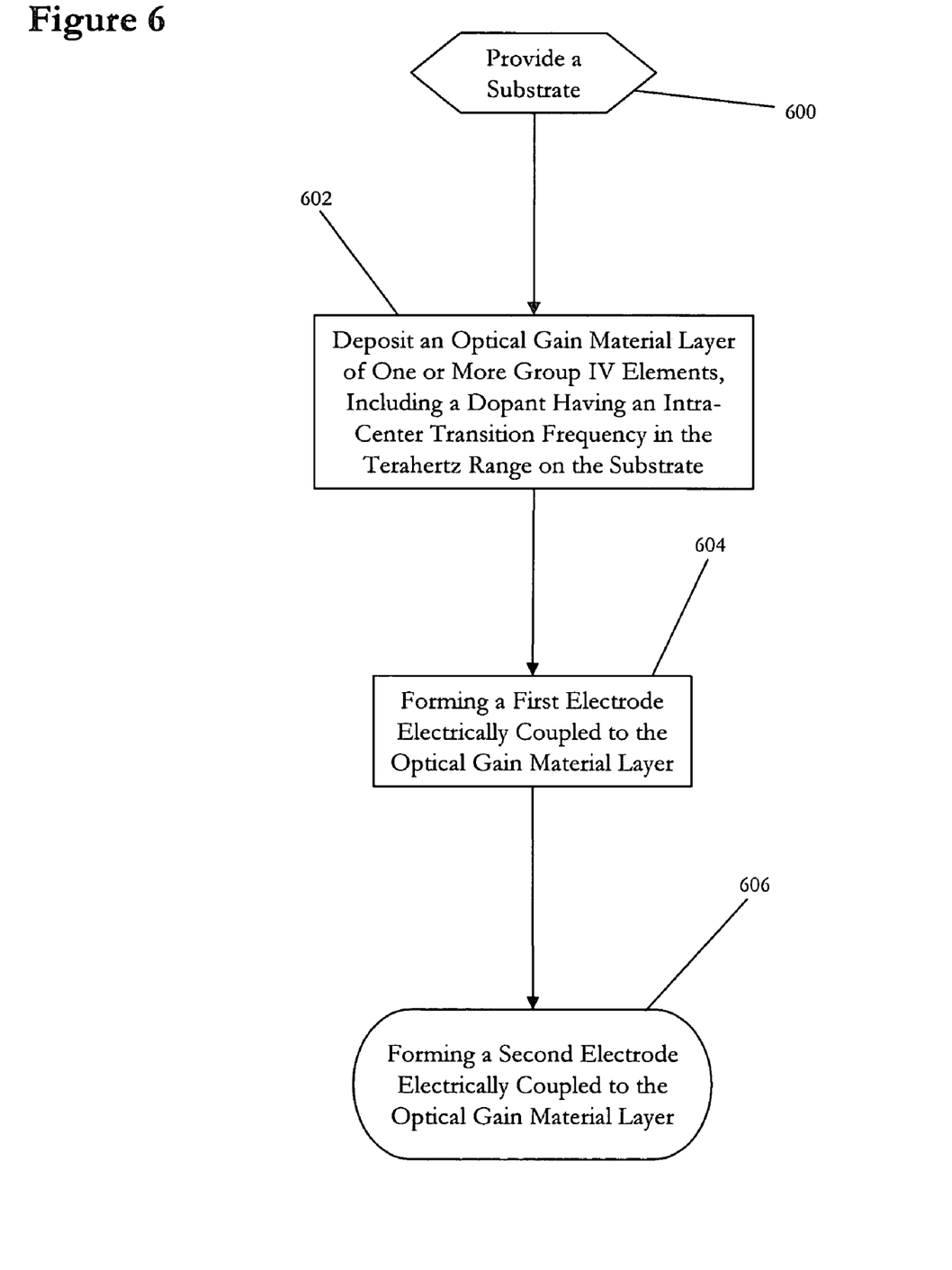
FIG. 6 is a flowchart illustrating a method of manufacture for the exemplary electrically-pumped THz frequency radiation source, or radiation detector, of FIG. 4B.

FIG. 6 illustrates an exemplary method of manufacturing the exemplary THz frequency radiation source of FIG. 4B. Substrate 412 is provided, step 600. The provided substrate may include multiple layers, circuitry, and/or distributed feedback element 414. Doped optical gain material 400 is formed on this substrate, step 602. This optical gain material layer is formed substantially of at least one group IV element and doped with at least one dopant having an intra-center transition frequency in a range of about 0.3 THz to 30 THz. The optical gain material layer may be deposited using any standard semiconductor fabrication process, including: (i) sputtering optical gain material onto the substrate; (ii) depositing the optical gain material onto the substrate by vaporization deposition; (iii) depositing the optical gain material onto the substrate by evaporation deposition; and (iv) epitaxially growing the optical gain material on the substrate.

A first electrode, which is electrically coupled to the optical gain material layer, is formed, step 604, as is a second electrode, step 606. These electrodes may be formed using any of the methods described above with reference to the exemplary method of FIG. 5. It is noted that the second electrode may be formed on substrate 412 in this exemplary embodiment, if substrate 412 is formed of electrically conductive material.

FIG. 4C illustrates an additional exemplary electrically-pumped THz frequency radiation source. In this exemplary electrically-pumped THz frequency radiation source, doped optical gain material 400 is formed as a doped region within substantially undoped material 416, which is formed substantially of at least one group IV element. FIG. 4C also illustrates an exemplary electrode configuration with electrodes 402 and 404 formed on separate portions of the same surface of the group IV material piece which includes doped optical gain material 400 and substantially undoped material 416.

Figure 7:
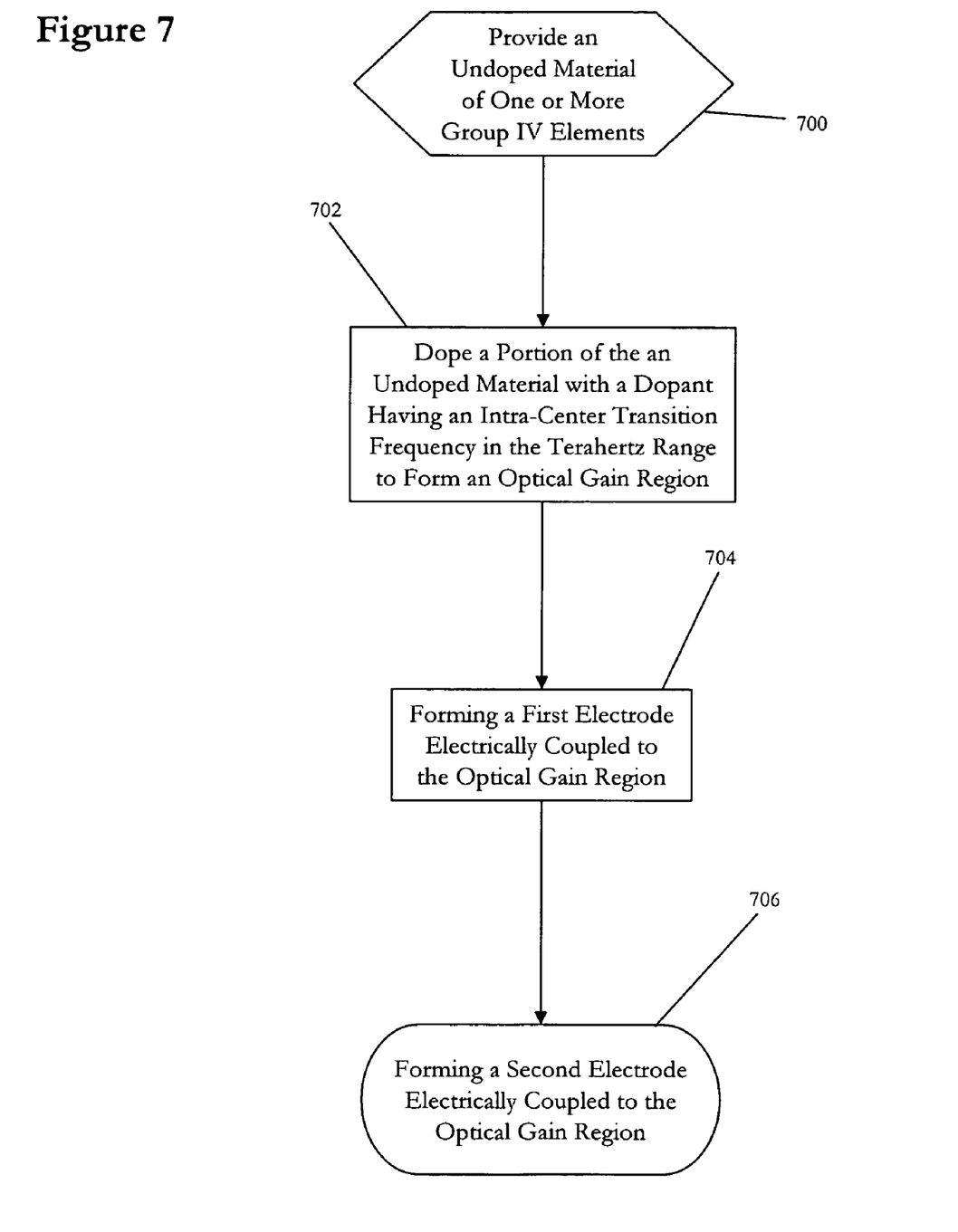
FIG. 7 is a flowchart illustrating a method of manufacture for the exemplary electrically-pumped THz frequency radiation source, or radiation detector, of FIG. 4C.

FIG. 7 illustrates an exemplary method of manufacturing the exemplary THZ frequency radiation source of FIG. 4C. A substantially undoped material formed substantially of at least one group IV element is provided, step 700. At least a portion of this substantially undoped material is doped, step 702, with at least one dopant that has an intra-center transition frequency in the THz range to form the doped optical gain material region. This region may be doped using any standard semiconductor doping technique, including: (i) diffusing the dopant(s) into the desired portion of the substantially undoped material; or (ii) ion implanting the dopant(s) into the desired portion of the substantially undoped material.

First electrode 402 electrically coupled to optical gain material region 400 is formed, step 704, as is second electrode 404, step 706. These electrodes may be formed using any of the methods described above with reference to the exemplary method of FIG. 5.

It is contemplated that exemplary electrically-pumped THz frequency radiation source of the present invention may be optimized for higher output power and higher temperature operation than the exemplary devices used to obtain the data illustrated in FIGS. 1, 2A, 2B, and 3. In particular, it is contemplated that further tests of exemplary devices formed with diamond and silicon carbide optical gain media may lead to higher temperature operation. The exemplary embodiments described above demonstrate a number of THz frequency radiation sources (and detectors) based on silicon germanium technology, as well as other group IV material processing technologies. These exemplary sources (and detectors) may find use in wide ranging fields, including biological, chemical, and medical imaging and various sensing applications.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An electrically-pumped THz frequency radiation source comprising:
    an optical gain material formed substantially of at least one group IV element and doped with at least one dopant having an intra-center transition frequency in a range of about 0.3 THz to 30 THz, the at least one dopant including;
        a first co-dopant of a first carrier type having a first intra-center transition frequency; and
        a second co-dopant of the first carrier type having a second intra-center transition frequency;
    a first electrode electrically coupled to the optical gain material; and
    a second electrode electrically coupled to the optical gain material:
    wherein:
        a first dopant concentration of the first co-dopant is approximately equal to a second co-dopant concentration of the second dopant; and
        the first intra-center transition frequency is not equal to the second intra-center transition frequency.

2. The electrically-pumped THz frequency radiation source of claim 1, wherein the optical gain material is an unstrained bulk optical gain material.

3. The electrically-pumped THz frequency radiation source of claim 1, wherein the optical gain material includes at least one of:
    a crystalline material formed of one group IV element;
    a crystalline material formed of an alloy of group IV elements; or
    an amorphous material formed of a group IV element.

4. The electrically-pumped THz frequency radiation source of claim 1, wherein the optical gain material is selected from a group consisting of: diamond, crystalline silicon, crystalline germanium, crystalline silicon carbide, crystalline silicon germanium, polycrystalline silicon, amorphous diamond, amorphous silicon, and amorphous germanium.

5. The electrically-pumped THz frequency radiation source of claim 1, wherein the first co-dopant is one of a group III element or a group V element.

6. The electrically-pumped THz frequency radiation source of claim 1, wherein the first co-dopant is a shallow depth dopant.

7. The electrically-pumped terahertz frequency radiation source of claim 1, wherein the first co-dopant is selected from a group consisting of: boron, phosphorus, gallium, antimony, arsenic, and aluminum.

8. The electrically-pumped THz frequency radiation source of claim 1, wherein
a first dopant concentration of the first co-dopant is at least five times a second dopant concentration of the second co-dopant.

9. The electrically-pumped THz frequency radiation source of claim 1, wherein a resistivity of the optical gain material is in the range of about 1 to 10 ohm-cm.

10. The electrically-pumped THz frequency radiation source of claim 1, wherein:
the first electrode is formed of at least one of aluminum, gold, silver, copper, nickel, titanium, tungsten, platinum, germanium, polyaniline, or polysilicon; and
the second electrode is formed of at least one of aluminum, gold, silver, copper, nickel, titanium, tungsten, platinum, germanium, polyaniline, or polysilicon.

11. The electrically-pumped THz frequency radiation source of claim 1, wherein the first electrode forms a Schottky barrier contact with the optical gain material.

12. The electrically-pumped THz frequency radiation source of claim 1, wherein the first electrode forms a substantially ohmic contact with the optical gain material.

13. The electrically-pumped THz frequency radiation source of claim 1, further comprising:
a first reflective element and a second reflective element substantially parallel to the first reflective element, the first reflective element and the second reflective element being arranged on either side of the optical gain material to form a Fabry-Perot laser cavity;
wherein:
a reflectivity of the first reflective element is less than 100% ; and the electrically-pumped THz frequency radiation source emits coherent THz frequency radiation through the first reflective element.

14. The electrically-pumped THz frequency radiation source of claim 1, wherein the optical gain material is coupled to a substrate.

15. The electrically-pumped THz frequency radiation source of claim 14, wherein:
the substrate includes a distributed feedback element;
the distributed feedback element is optically coupled to the optical gain material; and
the electrically-pumped THz frequency radiation source emits coherent THz frequency radiation.

16. The electrically-pumped THz frequency radiation source of claim 1, wherein the optical gain material is formed as a doped region within a substantially undoped material formed substantially of at least one group IV element.

17. The electrically-pumped THz frequency radiation source of claim 1, wherein the optical gain material is a bulk amorphous optical gain material.

18. The electrically-pumped THz frequency radiation source of claim 17, wherein the bulk amorphous optical gain material is formed of a group IV element.

19. The electrically-pumped THz frequency radiation source of claim 17, wherein the bulk amorphous optical gain material is selected from a group consisting of: amorphous diamond, amorphous silicon, and amorphous germanium.

20. The electrically-pumped THz frequency radiation source of claim 17, wherein a resistivity of the bulk amorphous optical gain material is in the range of about 1 to 10 ohm-cm.

* * * * *